United States Patent
Parkhe

(10) Patent No.: US 11,482,444 B2
(45) Date of Patent: Oct. 25, 2022

(54) HIGH TEMPERATURE MICRO-ZONE ELECTROSTATIC CHUCK

(71) Applicant: Applied Materials, Inc., Santa Clara, CA (US)

(72) Inventor: Vijay D. Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 295 days.

(21) Appl. No.: 16/836,754

(22) Filed: Mar. 31, 2020

(65) Prior Publication Data

US 2021/0287930 A1 Sep. 16, 2021

Related U.S. Application Data

(63) Continuation-in-part of application No. 16/814,636, filed on Mar. 10, 2020.

(51) Int. Cl.
| | | |
|---|---|---|
| *H01L 21/687* | (2006.01) | |
| *H01L 21/683* | (2006.01) | |
| *H01J 37/32* | (2006.01) | |
| *H05B 3/14* | (2006.01) | |

(52) U.S. Cl.
CPC .... *H01L 21/68757* (2013.01); *H01L 21/6833* (2013.01); *H01J 37/32724* (2013.01); *H05B 3/143* (2013.01)

(58) Field of Classification Search
CPC .......... H01L 21/68757; H01L 21/6833; H01L 21/6831; H01L 21/68785; H01L 21/67103; H01J 37/32724; H05B 3/143; H05B 3/283
USPC ...................................... 361/234
See application file for complete search history.

(56) References Cited

U.S. PATENT DOCUMENTS

| | | |
|---|---|---|
| 5,796,074 A | 8/1998 | Edelstein et al. |
| 6,730,175 B2 | 5/2004 | Yudovsky et al. |
| 2014/0159325 A1 | 6/2014 | Parkhe et al. |
| 2016/0343600 A1* | 11/2016 | Parkhe ............. H01L 21/68785 |
| 2017/0280509 A1 | 9/2017 | Takebayashi |

(Continued)

FOREIGN PATENT DOCUMENTS

| | | |
|---|---|---|
| JP | 2016100473 A | 5/2016 |
| KR | 20170023965 A | 3/2017 |

(Continued)

OTHER PUBLICATIONS

International Search Report and Written Opinion for PCT/US2021/017438 dated Jun. 7, 2021.

*Primary Examiner* — Dharti H Patel
(74) *Attorney, Agent, or Firm* — Patterson + Sheridan, LLP

(57) ABSTRACT

Implementations described herein provide a substrate support assembly. The substrate support assembly has a first ceramic plate having a workpiece supporting surface and a bottom surface. The first ceramic plate has a plurality of secondary heaters each forming a plurality of micro zones. The substrate support assembly has a second ceramic plate having an upper surface and a lower surface. A first metal bonding layer is disposed between the bottom surface of the first ceramic plate and the upper surface of the second ceramic plate. A third ceramic plate has a top portion and a bottom portion. The third ceramic plate has primary heaters. A second metal bonding layer is disposed between the lower surface of the second ceramic plate and the top portion of the third ceramic plate.

20 Claims, 5 Drawing Sheets

(56) References Cited

U.S. PATENT DOCUMENTS

2018/0197758 A1* 7/2018 Parkhe .............. H01L 21/68785
2019/0341289 A1* 11/2019 Parkhe .............. H01L 21/68785

FOREIGN PATENT DOCUMENTS

| WO | 2014182711 A1 | 11/2014 |
| WO | 2016094404 A1 | 6/2016 |
| WO | 2021016223 A1 | 1/2021 |

\* cited by examiner

HIGH TEMPERATURE MICRO-ZONE ELECTROSTATIC CHUCK

BACKGROUND

Field

Implementations described herein generally relate to semiconductor manufacturing and more particularly to a high temperature substrate support assembly having a plurality of micro-zone heaters.

Description of the Related Art

Reliably producing nanometer and smaller features is one of the key technology challenges for next generation very large scale integration (VLSI) and ultra-large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

To drive down manufacturing cost, integrated chip (IC) manufactures demand higher throughput and better device yield and performance from every silicon substrate processed. Some fabrication techniques being explored for next generation devices under current development require processing at temperatures above 300 degrees Celsius and high bias power while processing films on a substrate. The high bias power improves the film roughness and morphology on the substrate. However, the high bias power also generates heat energy which if not managed, may undesirably limit the choice of materials or processes that can be performed while processing the substrate.

Some of these high temperature and high power fabrication techniques are performed in processing chambers that utilize electrostatic chucks to secure a substrate being processed within the chamber. Conventional electrostatic chucks (ESC) are part of a substrate support assembly that a plurality of heating zones to ensure processing uniformity across the surface of the ESC. However, the thermal smear, or outward heat dissipation, between adjacent heating zones often result in an undesired heat profile due to heat undesirably moving laterally between adjacent areas in an unplanned manner. Consequently, the desired heat profile of the ESC and the processing results are challenging to obtain.

Thus, there is a need for an improved substrate support assembly having a plurality of heaters.

SUMMARY

Implementations described herein provide a substrate support assembly. The substrate support assembly has a first ceramic plate having a workpiece supporting surface and a bottom surface. The first ceramic plate has a plurality of secondary heaters each forming a plurality of micro zones. The substrate support assembly has a second ceramic plate having an upper surface and a lower surface. A first metal bonding layer is disposed between the bottom surface of the first ceramic plate and the upper surface of the second ceramic plate. A third ceramic plate has a top portion and a bottom portion. The third ceramic plate has primary heaters. A second metal bonding layer is disposed between the lower surface of the second ceramic plate and the top portion of the third ceramic plate.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Implementations described herein provide a substrate support assembly which enables high temperature operation of an electrostatic chuck (ESC) having a plurality of heaters producing a micro-zone effect. Here, micro zones refer to discretely temperature controllable areas of the ESC wherein in the examples disclosed below, there may be 50 to 150 or more micro zones on the ESC. The high temperature is intended to refer to temperatures in excess of about 150 degrees Celsius, for example, temperatures in excess of about 300 degrees Celsius. The examples of the substrate support assemblies provided below include a cooling plate and an electrostatic chuck separated by a bonding layer and a thermal interface layer. The thermal interface layer is formed from a glass that is capable of producing a temperature gradient across the thermal interface of between about 150° C. to about 260° C. The arrangement of the thermal interface between the electrostatic chuck and the cooling base reduces temperature drain and thermal smearing between the micro zones in the electrostatic chuck.

Although the substrate support assembly is described below in an etch processing chamber, the substrate support assembly may be utilized in other types of plasma processing chambers, such as physical vapor deposition chambers, chemical vapor deposition chambers, ion implantation chambers, among others, and other systems where high temperature (i.e., temperatures exceeding 150 degrees Celsius) processing occurs.

Figure 1:
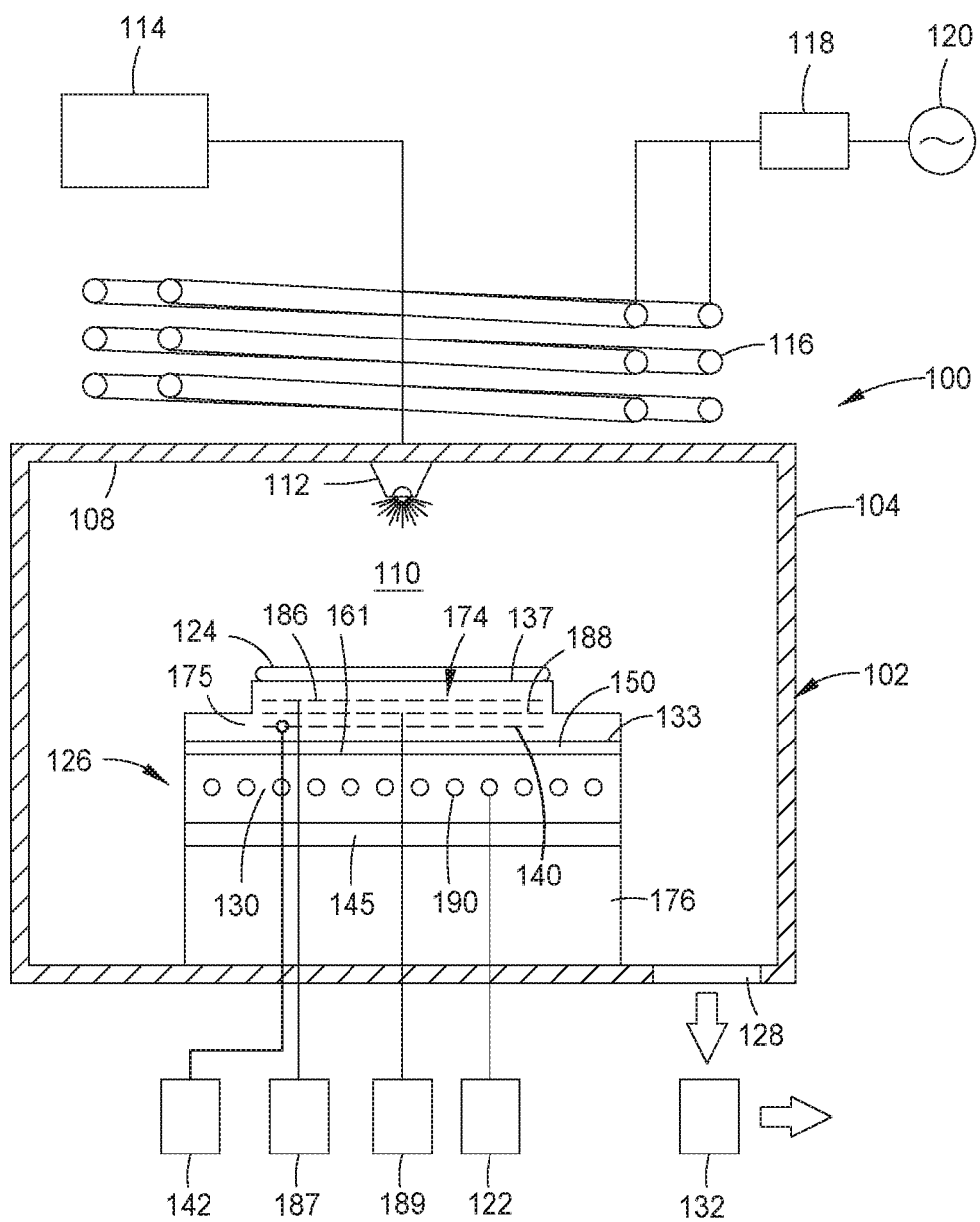
FIG. 1 is a cross-sectional schematic side view of a processing chamber having one embodiment of a substrate support assembly.

FIG. 1 is a cross-sectional schematic view of an exemplary plasma processing chamber 100, shown configured as an etch chamber, having a substrate support assembly 126. The substrate support assembly 126 may be utilized in other types of processing plasma chambers, for example plasma treatment chambers, annealing chambers, physical vapor deposition chambers, chemical vapor deposition chambers, and ion implantation chambers, among others, as well as other systems where the ability to control processing uniformity for a surface or workpiece, such as a substrate, is desirable. Control of the dielectric properties tan(δ), i.e., dielectric loss, or ρ, i.e., the volume resistivity at elevated temperature ranges for the substrate support assembly 126 beneficially enables azimuthal processing control, i.e., processing uniformity, for a substrate 124 disposed on the substrate support assembly 126 during processing.

The plasma processing chamber 100 includes a chamber body 102 having sidewalls 104, a bottom and a lid 108 that enclose an interior processing region 110. An injection apparatus 112 is coupled to the sidewalls 104 and/or lid 108 of the chamber body 102. A gas panel 114 is coupled to the injection apparatus 112 to allow process gases to be provided into the processing region 110. The injection apparatus 112 may be one or more nozzle or inlet ports, or alternatively, a showerhead. Processing gas, along with any processing by-products, are removed from the processing region 110 through an exhaust port 128 formed in the sidewalls 104 or bottom 106 of the chamber body 102. The exhaust port 128 is coupled to a pumping system 132, which includes throttle valves and pumps utilized to control the vacuum levels within the processing region 110.

The processing gas may be energized to form a plasma within the processing region 110. The processing gas may be energized by capacitively or inductively coupling RF power to the processing gases. In the embodiment depicted in FIG. 1, a plurality of coils 116 are disposed above the lid 108 of the plasma processing chamber 100 and are coupled through a matching circuit 118 to an RF power source 120. Power applied to the plurality of coils 116 inductively coupled power to the processing gas to form a plasma within the processing region 110.

The substrate support assembly 126 is disposed in the processing region 110 below the injection apparatus 112. The substrate support assembly 126 includes an electrostatic chuck (ESC) 174 and a cooling base 130. The cooling base 130 may optionally be supported by a base plate 176. The base plate 176 is supported by one of the sidewalls 104 or bottom 106 of the processing chamber 100. Additionally, the substrate support assembly 126 may include a facility plate 145 and/or an insulator plate (not shown) disposed between the cooling base 130 and the base plate 176 to facilitate electrical, cooling, and gas connections with the substrate support assembly 126.

The cooling base 130 is formed from a metal material or other suitable material. For example, the cooling base 130 may be formed from aluminum (Al). The cooling base 130 includes cooling channels 190 formed therein. The cooling channels 190 are connected to a heat transfer fluid source 122 by a transfer fluid conduit 192. The heat transfer fluid source 122 provides a heat transfer fluid, such as a liquid, gas or combination thereof, which is circulated through the cooling channels 190 in the cooling base 130. In one embodiment, the heat transfer fluid circulating through the cooling channels 190 of the cooling base 130 maintains the cooling base 130 at a temperature between about 30 degrees Celsius and about 120 degrees Celsius or at a temperature lower than about 90 degrees Celsius.

The ESC 174 includes one or more chucking electrodes 186 disposed in a dielectric body 175. The dielectric body 175 has a workpiece support surface 137 and a bottom surface 133 opposite the workpiece support surface 137. The dielectric body 175 of the ESC 174 is fabricated from a ceramic material, such as alumina ($Al_2O_3$), aluminum nitride (AlN) or other suitable material. Alternately, the dielectric body 175 may be fabricated from a polymer, such as polyimide, polyetheretherketone, polyaryletherketone and the like.

The dielectric body 175 includes one or more primary resistive heaters 188 embedded therein. The primary resistive heaters 188 may alternatively be located in another portion of the substrate support assembly 126. The primary resistive heaters 188 are utilized to elevate the temperature of the substrate support assembly 126 to a temperature suitable for processing the substrate 124 disposed on the workpiece support surface 137 of the substrate support assembly 126. The primary resistive heaters 188 are coupled through the facility plate 145 to a heater power source 189. The heater power source 189 provides power to the primary resistive heaters 188. A controller is utilized to control the operation of the heater power source 189, which is generally set to heat the substrate 124 to a predefined temperature. In one embodiment, the primary resistive heaters 188 are arranged in a plurality of laterally separated heating zones, wherein the controller enables at least one zone of the primary resistive heaters 188 to be preferentially heated relative to the primary resistive heaters 188 located in one or more of the other zones. For example, the primary resistive heaters 188 may be arranged concentrically in a plurality of radially separated primary heater zones (Shown in FIG. 1A as item 181). In one example, the primary resistive heaters 188 are arranged in four concentric primary heater zones 181, a first primary heater zone $181_1$, a second primary heater zone $181_2$, a third primary heater zone $181_3$, and a fourth primary heater zone 1814. The primary resistive heaters 188 may maintain the substrate 124 at a temperature suitable for processing, such as between about 180 degrees Celsius to about 500 degrees Celsius, such as greater than about 250 degrees Celsius, such as between about 250 degrees Celsius and about 350 degrees Celsius or more.

The ESC 174 additionally includes a plurality of secondary heaters 140. The number of secondary heaters 140 may be an order of magnitude greater than the number of primary resistive heaters 188. The secondary heaters 140 serve to control the temperature of the ESC 174 at a micro level, such as plus or minus 5 degrees Celsius, while the primary resistive heaters 188 control the temperature of the ESC 174 at a macro level. The ESC 174 also has a plurality of micro zones, such as 50 to 150 micro zones or more, that are temperature controlled by the secondary heaters 140. The secondary heaters 140 form temperature control in small discrete locations, i.e., micro-zones on the ESC 174.

Figure 1A:
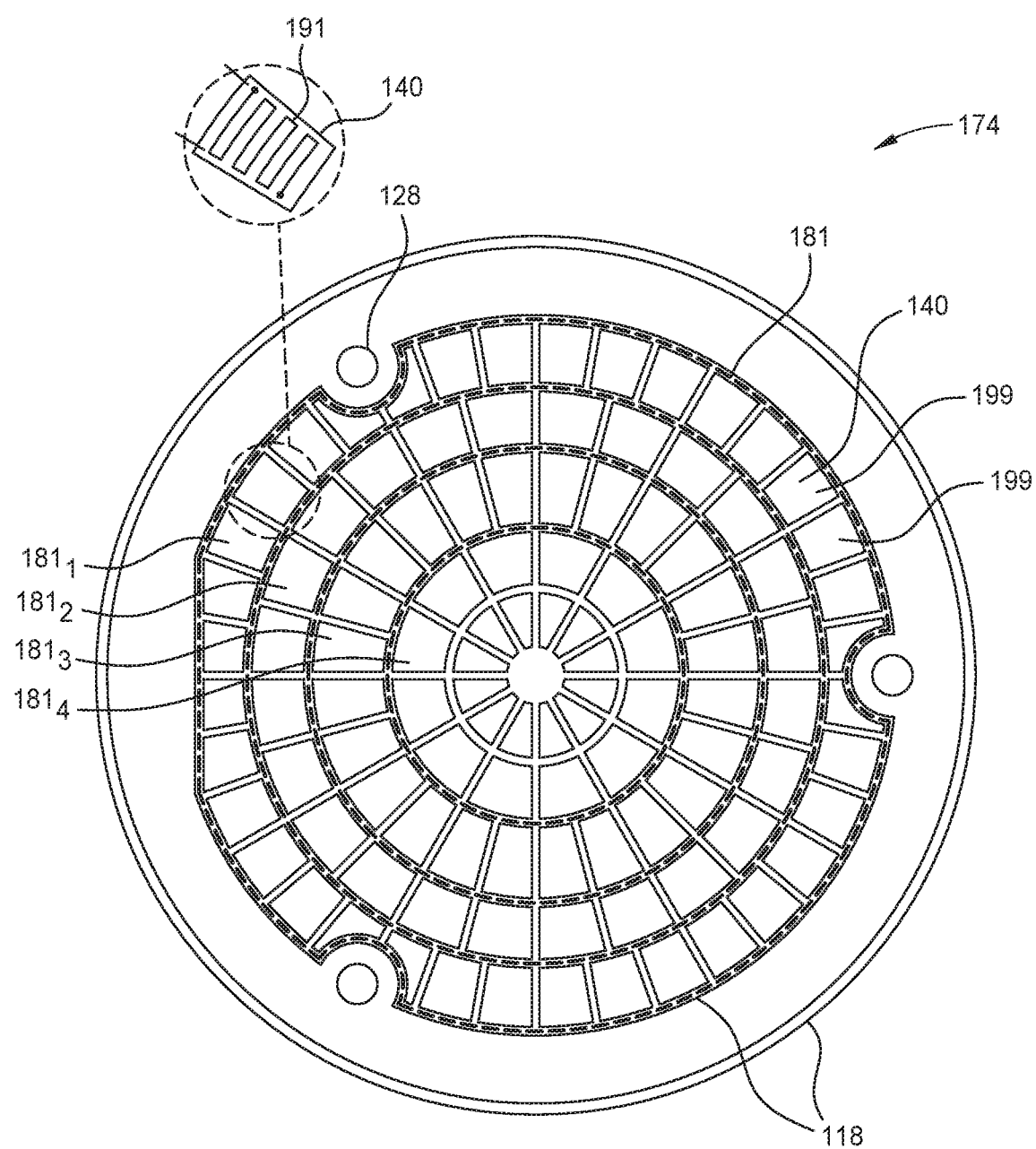
FIG. 1A is a schematic cross-sectional view of an electrostatic chuck of the substrate support assembly illustrating a plurality of secondary heaters.

Turning briefly to FIG. 1A, FIG. 1A is a schematic cross-sectional view of the ESC 174 of the substrate support assembly 126 illustrating the plurality of secondary heaters 140. The ESC 174 illustrates one embodiment for the plurality of secondary heaters 140. The secondary heaters 140 may be configured in a pattern to efficiently generate a heat profile along the surface of the substrate support assembly 126. The pattern may be symmetric about a midpoint while providing clearance in and around holes 128 for lift pins or other mechanical, fluid or electrical connections. The secondary heaters 140 are arranged in a plurality of cells, i.e., micro zones 199. It is contemplated that each secondary heater 140 occupies a respective single micro-zone 199. A thermal choke 118 is disposed between each neighboring micro-zone 199. Additionally, the thermal choke 118 may be disposed along an outer perimeter of the ESC 174. The thermal choke 118 limits heat transfer from adjacent micro zones to prevent heat smearing and true thermal control of each micro-zone 199 by its respective secondary heater 140.

The number of micro zones 199 shown is for illustrative purposes only, and it is contemplated that the number of micro zones 199 would exceed 50 or more, such as 150 or more zones. Thus, the number of secondary heaters 140 located across the substrate support assembly 126 may easily be in excess of several hundred. Each micro-zone 199 of the secondary heaters 140 occupies a single one of the primary heater zones 181. A boundary or thermal choke 118 of the micro-zone 199 is coincident with a boundary 182 of a respective primary heater zone 181, for example, the first primary heater zone $181_1$, such that the micro-zone 199 is fully contained in only the first primary heater zone $181_1$ and does not extend into the second primary heater zone $181_2$.

Each secondary heater 140 has a resistor 191 ending in terminals. As current enters one terminal and exists the other terminal the current travels across the wire of the resistor and generates heat. The amount of heat released by the resistor 191 is proportional to the square of the current passing therethrough. The power design density may be between about 1 watt/cell to about 100 watt/cell, such as 10 watt/cell.

The resistor 191 may have a film thickness and a wire thickness configured to efficiently provide heat when a current is passed along the resistor 191. An increase in the wire thickness for the resistor 191 may result in a decrease in the resistance R of the resistor 191. The wire thickness may range from about 0.05 mm to about 0.5 mm for a tungsten wire and about 0.5 mm to about 1 mm for a nichrome wire. Recalling the formula $R=\rho \cdot l/A$, it can be seen that the material, length of wire, and the wire thickness may be selected for the resistor 191 to control cost, power consumption, and the heat generated by each secondary heater 140. In one embodiment, a resistor 191 is comprised of tungsten having a wire thickness of about 0.08 mm and a resistance of about 90 Ohms at 10 watts of power.

Returning to FIG. 1, each secondary heater 140 may be controlled by a controller 142. The controller 142 may turn on a single secondary heater 140; or a plurality of secondary grouped together. In this manner, temperature can be precisely controlled at independent locations along the micro zones 199 formed in the ESC 174, such independent locations not limited to concentric ring such as known in the art. Although the pattern shown is comprised of smaller units, the pattern may alternatively have larger and/or smaller units, extend to the edge, or have other forms to form 150 or more discrete micro zones 199.

The ESC 174 generally includes a chucking electrode 186 embedded in the dielectric body 175. The chucking electrode 186 may be configured as a mono polar or bipolar electrode, or other suitable arrangement. The chucking electrode 186 is coupled through an RF filter to a chucking power source 187, which provides a DC power to electrostatically secure the substrate 124 to the workpiece support surface 137 of the ESC 174. The RF filter prevents RF power utilized to form a plasma (not shown) within the plasma processing chamber 100 from damaging electrical equipment or presenting an electrical hazard outside the chamber.

The workpiece support surface 137 of the ESC 174 includes gas passages (not shown) for providing backside heat transfer gas to the interstitial space defined between the substrate 124 and the workpiece support surface 137 of the ESC 174. The ESC 174 also includes lift pin holes for accommodating lift pins (not shown) for elevating the substrate 124 above the workpiece support surface 137 of the ESC 174 to facilitate robotic transfer into and out of the plasma processing chamber 100.

A bonding layer 150 is disposed below the ESC 174 and secures the ESC 174 to the cooling base 130. In other embodiments, the bonding layer 150 is disposed between the ESC 174 and a lower plate that is disposed between the ESC 174 and cooling base 130. The bonding layer 150 may include a glass material and or formed from a glass plate. For example, the bonding layer 150 may contain nickel gallium oxide (NGO) silicon oxide, polyimide, silicon or other suitable material. The bonding layer 150 provides a thermal break between the ESC 174 and the cooling base 130 to improve the high temperature micro-zone effect by reducing the heat loss from the micro zones 199 to the cooling base 130. The bonding layer 150 may have a thermal conductivity between about 0.1 W/mK and about 5 W/mk. The composition of the bonding layer 150 is selected to compensate for differences in thermal expansion between the ESC 174 and underlying portions of the substrate support assembly 126, such as for example, the cooling base 130. The bonding layer 150 may be formed from a polymer instead of silicone for high temperature applications, for example substrate processing above 300 degrees Celsius. The bonding layer 150 is formed from a glass material with the same thermal expansion and thermal conductivity to inhibit bowing due to a mismatch or temperature gradient between the ESC 174 and the cooling base 130.

Figure 2:
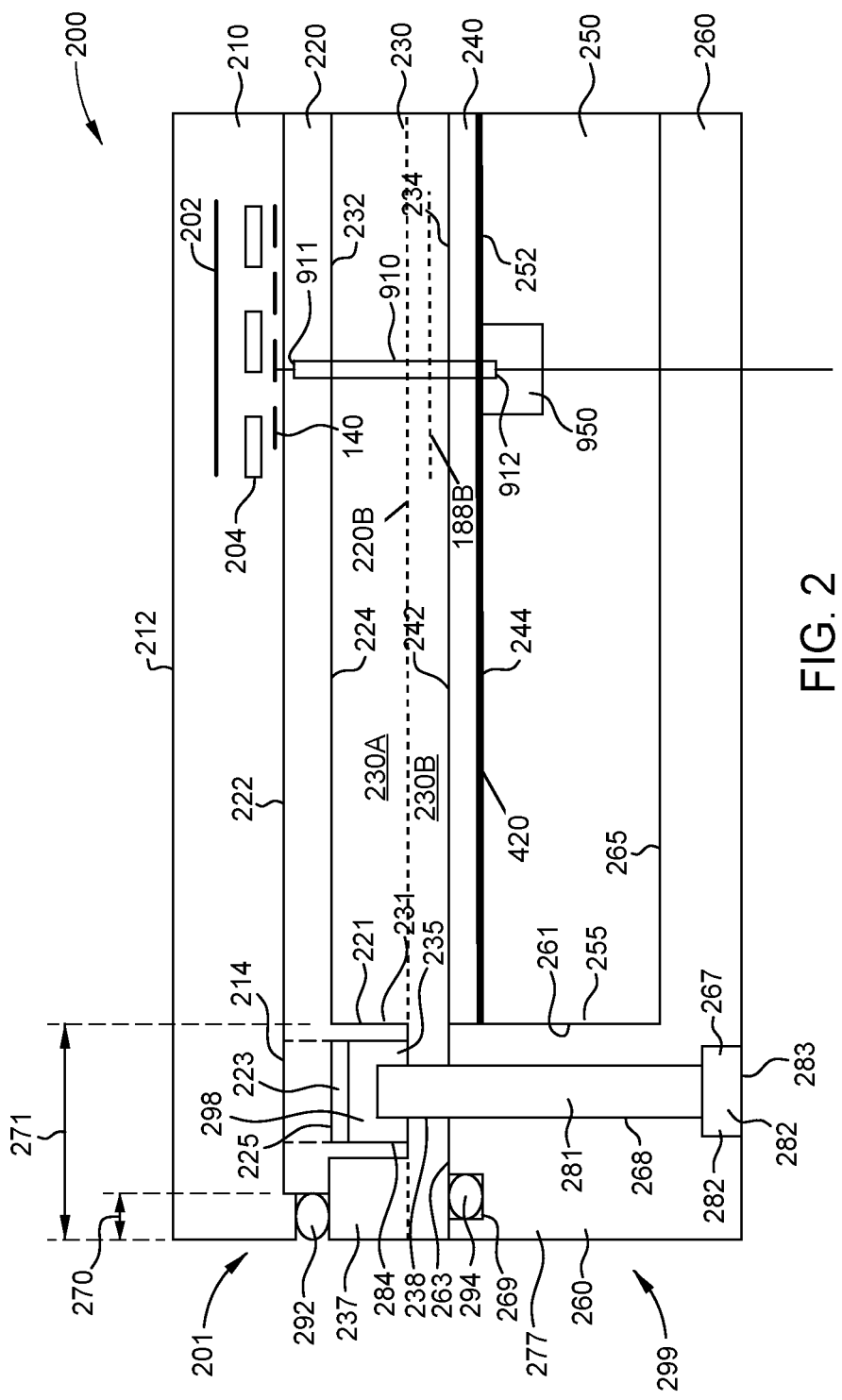
FIG. 2 is a schematic partial side view of the substrate support assembly, according to one example.

FIG. 2 is a schematic partial side view of the substrate support assembly 200, according to one example. The substrate support assembly 200 may be utilized in the processing chamber 100 described above in place of the substrate support assembly 126. The substrate support assembly 200 is formed from a stack of layers which include a ceramic ESC 210, metal bond 220, a ceramic plate 230, a thermal interface layer 240 and a cooling base 250. Cooling base 250 may be substantially similar to cooling base 130 shown in FIG. 1. The ceramic ESC 210 is configured to operate at temperatures up to and exceeding 300 degrees Celsius. The substrate support assembly 200 utilizes the thermal interface layer 240 to reduce the heat transfer between the ESC 210 and the cooling base 250 while preventing warping, bowing or other undesirable thermally induced movement in the stack of layers forming the substrate support assembly 200. The thermal interface layer 240 additionally inhibits the cooling base 250 from smearing the discrete temperature micro zones 199 in the ESC 210. For example, the thermal interface layer 240 inhibits the heat transfer from the secondary heaters 140 to the cooling base 250 instead of the micro zones 199 along the workpiece support surface 137.

The ceramic ESC 210 has a substrate supporting surface 212 and a lower surface 214. The ceramic ESC 210 has a body formed from a ceramic material such as alumina or other suitable material. The ceramic ESC 210 has a first coefficient of thermal expansion. The ceramic ESC 210 has one or more electrodes 202 and a plurality of heaters 204 disposed in the body. The electrodes 202 are configured for chucking a substrate to the substrate supporting surface 212. The plurality of heaters 204 includes the secondary heaters for creating a multitude of micro zones 199 for discreetly heating the substrate supporting surface 212 and thus, discretely heating a substrate supported on the substrate supporting surface 212.

The metal bond 220 has a top surface 222 and a bottom surface 224. The top surface 222 is disposed against the lower surface 222 of the ESC 210. The bottom surface 224 is disposed against the ceramic plate 230. The metal bond 220 may also act as an RF electrode supplementing or replacing electrodes 202. The metal bond 220 may be in a sheet. The metal bond 220 may have one or more holes 225 formed therein. The material of the metal bond 220 forming the holes 225 may extend away in one or more flaps 221. For example, the metal bond 220 may have one or more small slits in a circular pattern such that the slits form the flaps 221 surrounding the holes 225 when the flaps 221 are pushed out of plane, such as orthogonally, from the sheet of the metal bond 220. The connection enabling the metal bond 220 to act as the RF electrode is discussed below.

The ceramic plate 230 has a top surface 232 and a bottom surface 234. The top surface 232 is in contact with the bottom surface 224 of the metal bond 220. The bottom surface 234 is in contact with the thermal interface layer 240. A cavity 235 having sidewalls 231 is formed through the top surface 232 into the ceramic plate 230. A hole 238 extends from the bottom of the cavity 235 and out the bottom surface 224 of the ceramic plate 230. The flaps 221 of the metal bond 220 extends down the sidewalls 231 of the cavity 235. The ceramic plate 230 may be formed from alumina or other suitable material. The ceramic plate 230 has a second coefficient of thermal expansion, i.e., a greater expansion coefficient along the thickness of the ceramic plate 230. The second coefficient of thermal expansion for the ceramic plate 230 is equal to or greater than the first coefficient of thermal expansion for the ESC 210.

Alternately, or additionally, the coefficient of thermal expansion increases from the ESC 210 to the ceramic plate 230. The higher second coefficient of thermal expansion than the first coefficient of thermal expansion prevents the substrate support assembly 200 from bowing when it is heating up. In some examples, the secondary heaters 140 may be disposed in the ceramic plate 230 instead of the ESC 210. In another example, the secondary heaters 140 are disposed in the ESC 210 and the primary resistive heaters 188B are located in the ceramic plate 230. In yet another example, the ceramic plate 230 is formed from a first ceramic plate 230A and a second ceramic plate 230B. The first ceramic plate 230A and the second ceramic plate 230B is formed from the same material selection as the ceramic plate 230, such as AlO. However, it should be appreciated that the first ceramic plate 230A and the second ceramic plate 230B need not be formed from the same material. In one example, the first ceramic plate 230A and the second ceramic plate 230B has a thickness between about 5 mm and about 7 mm. The first ceramic plate 230A and the second ceramic plate 230B need not have the same thickness. For example, the first ceramic plate 230A may have a thickness of about 6 mm and the second ceramic plate 230B may have a thickness of about 6.5 mm. A second metal bond 220B couples the first ceramic plate 230A and the second ceramic plate 230B. The second metal bond 220B is contemplated to be similar to metal bond 220. However, the second metal bond 220B may have Al or other material independent and different than metal bond 220. The primary resistive heaters 188B may have 4 zones and be disposed in the first ceramic plate 230A or the second ceramic plate 230B. In one example, the primary resistive heaters 188B are disposed in the second ceramic plate 230B. In such an example, the secondary heaters are disposed in the ESC 210, gas distribution is disposed in the first ceramic plate 230A and the 4 zone primary heaters 188 are disposed in the second ceramic plate 230B.

The metal bond 220 does not extend the full length of the ceramic plate 230 or the ceramic ESC 210. A first gap 270 extends between an outer edge of the metal bond 220 and the outer periphery of the ceramic ESC 210 and ceramic plate 230. The first gap 270 is size to accept a seal 292, or such as an o-ring. The seal 292 forms a seal between the ceramic ESC 210 and the ceramic plate 230. The seal 292 protects the metal bond 220 from exposure to the plasma and chemicals present in the processing chamber environment, thereby extending the longevity of the metal bond 220.

The thermal interface layer 240 has an upper surface 242 and a lower surface 244. The upper surface 242 is in contact with the bottom surface 234 of the ceramic plate 230. The lower surface 244 may include an insulating bond 420 sized to the cooling base 250 and disposed on the cooling base 250. The insulating bond 420 permits up to a 300 degrees Celsius temperature differential between the ceramic plate 230 and the cooling base 250 without bowing or cracking in the ceramic plate 230. The thermal interface layer 240 may be formed from high temperature polymer, such as a polyimide, or other suitable material for high temperatures such as 300 degrees Celsius or more. In one example, the insulating bond 420 may be formed from $SiO_2$, NGO, or other suitable material. The thermal interface layer 240 has a thermal conductivity of about 0.2 W/mK to about 4 W/mK. Thus, a temperature differential across the thermal interface layer 240 may be between 100 degrees Celsius and 300 degrees Celsius, such as 200 degrees Celsius. The thermal interface layer 240 prevents the smearing of the micro-zone effect of the heaters in the ceramic ESC 210 by insulating the heat loss from the micro zones 199 to the cooling base 250. The thermal interface layer 240 includes a glass or insulating layer for high temperatures such as 300 degrees Celsius or more. The thermal interface layer 240 may have a thickness ranging between about ¼ mm to about 2½ mm.

The cooling base 250 has a plurality of cooling channels through which a cooling fluid is circulated during operation. The cooling base 250 has a top surface 252 that is in contact with the lower surface 244 of the thermal interface layer 240. The cooling base 250 and the thermal interface layer 240 have an outer diameter 255. The outer diameter 255 is a distance 271 short of an outer perimeter 201 of the ESC 210. The cooling base 250 has a convection cooling cavity 950. The cooling base 250 has a plurality of cooling channels in which a cooling fluid flows to regulate the temperature of the cooling base 250. The cooling base 250 regulates the temperature of the substrate support assembly 200 by flowing coolant therein to maintain the temperature of the cooling base 250 by removing heat with the cooling fluid. The convection cooling cavity 950 is maintained at a similar temperature, such as about 60° C., by the coolant flowing through the cooling base 250. Additionally, the cooling base 250 prevents the high temperatures generated from the heaters 204 in the ceramic ESC 210 from causing thermal damage to the facility plate and lower components of the substrate support assembly 200.

A facility plate 260 is disposed below the cooling base 250. The facility plate 260 an upper top surface 263, a lower top surface 265 and a bottom surface 283. A protrusion 277 extends to the upper top surface 263. The upper top surface 263 is disposed against the ceramic plate 230. The facility plate 260 has a seal groove 269 disposed therein the upper top surface 263. Alternately, the seal groove 269 may be formed on the bottom surface 234 of the ceramic plate 230. A gasket 294 is disposed in the seal groove 269 for making an airtight seal between the ceramic plate 230 and the facility plate 260. The protrusion 267 has an inner diameter 261. The inner diameter 261 extends from the lower top surface 265 to the upper top surface 263. The cooling base 250 is disposed on the lower top surface 265 and has an outer diameter 261 that extends to the inner diameter 261 of the facility plate 260.

The facility plate 260 is formed from aluminum, an aluminum alloy or other suitable material. The electrical connections powering the electrode, heaters and various components of the substrate support assembly 200 extend through the facility plate 260. The facility plate 260 has through-hole 268 extending therethrough. The through-hole 268 aligns with the hole 238 in the ceramic plate 230. A recess 267 is formed on the bottom surface 264 of the facility plate 260 and is aligned with the through-hole 268.

An insert 284 is provided in the cavity 235 of the ceramic plate 230. A fastener 281 has a head 282. The fastener 281 is configured to extend through the through-hole 268 to the insert 284 in the cavity 235. The head 282 of the fastener 281 fits in the recess 267 of the facility plate 260 and abuts against the through-hole 268 while not extending therein. The insert 284 is configured to accept the fastener 281 for securing the ceramic plate 230 to the facility plate 260. The insert 284 may be formed from an electrically conductive material, such as molybdenum, stainless steel, aluminum or other suitable material. The insert 284 is in contact with the flaps 221 of the metal bond 220. In this manner, a fastener 281 formed from a conductive material may provide an RF connection to the metal bond 220 when the metal bond 220 acts as an electrode. In other embodiments, the ceramic plate 230 is metalized, through coating or other techniques. The metalized ceramic plate 230 can act as the electrode with the fastener 281 forming the RF connection for powering the ceramic plate 230.

A micro-zone connector 910 is coupled to the secondary heaters 140 in the ESC 210. The micro-zone connector 910 provides the power and control over each individual secondary heater 140 for controlling the heat output at each micro-zone 199. The micro-zone connector 910 extends at a first end 911 from the secondary heaters 140 to the convection-cooled cavity 950 at a second end 912 of the micro-zone connector 910. The temperature of the convection-cooled cavity 950 may be maintained at about 60° C. to provide cooling to components placed therein. The temperature of the first end 911 of the micro-zone connector 910 may be 300° C. or more. The temperature of the second end 912 of the micro-zone connector 910 may be at about 60° C. Thus, the micro-zone connector 910 may see a temperature drop, differential, of more than 200° C. from the first end 911 to the second end 912 of the micro-zone connector 910.

Figure 3:
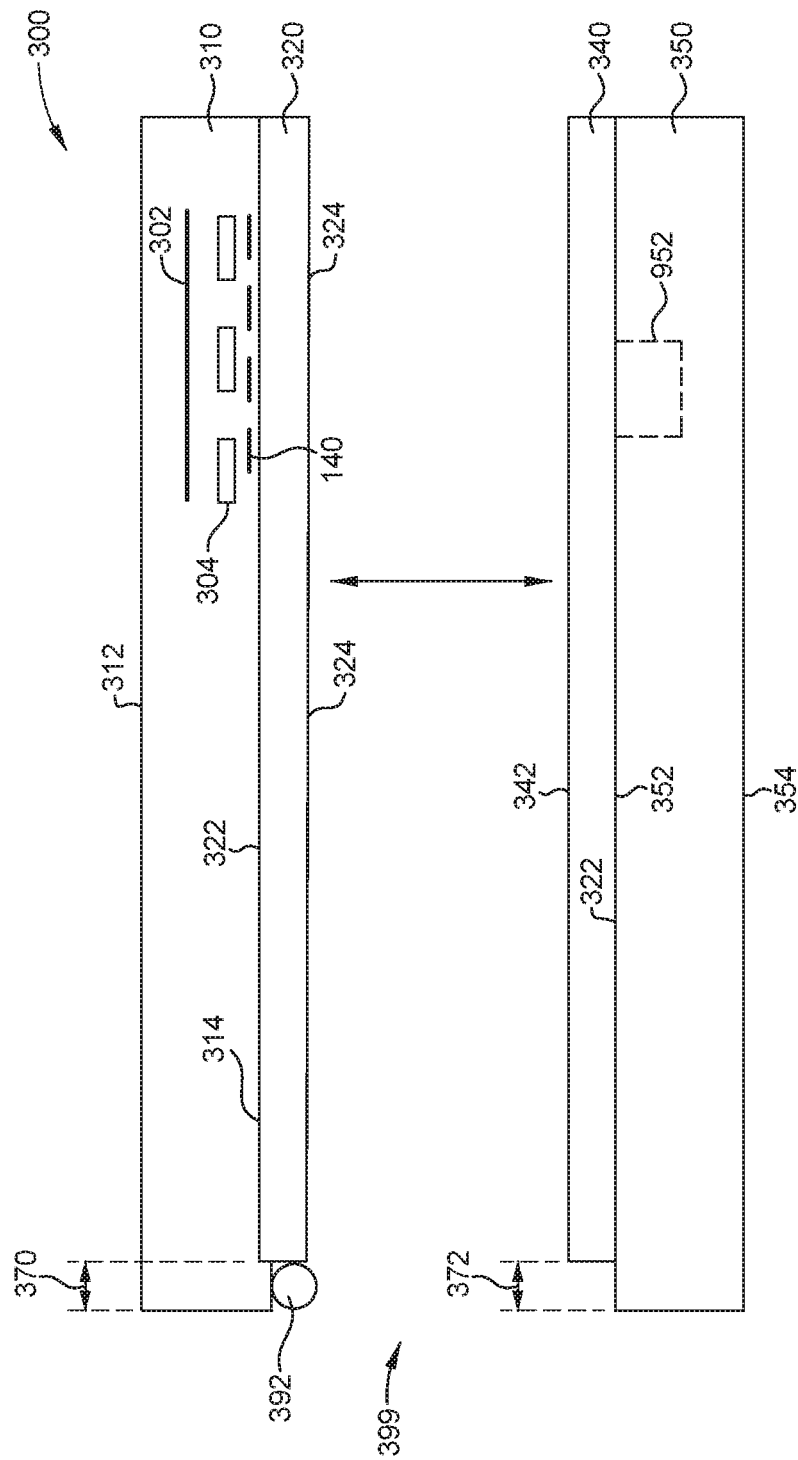
FIG. 3 is a schematic partial side view of the substrate support assembly, according to another example.

FIG. 3 is a schematic partial side view of the substrate support assembly 300, according to another example. The substrate support assembly 300 may be utilized in the processing chamber 100 described above in place of the substrate support assembly 126. The substrate support assembly 300 is formed from a stack of layers which include a ceramic ESC 310, an insulating bond 320, a bonding layer 340 and cooling base 350. Although here in FIG. 3, the substrate support assembly 300 is shown exploded, i.e., the insulating bond 320 shown separated from the bonding layer 340, while it should be appreciated that the insulating bond 320 and the bonding layer 340 are in contact with each other in practice. The embodiment of FIG. 3 provides for a simple stack design operable at high temperatures.

The ceramic ESC 310 is configured to operate at temperatures up to and exceeding 300 degrees Celsius. The substrate support assembly 300 utilizes the insulating bond 320 to reduce the temperature profile between the ceramic ESC 310 and the cooling base 350 while preventing warping, bowing or other undesirable thermally induced movement in the stack of layers forming the substrate support assembly 300.

The ceramic ESC 310 has a substrate supporting surface 312 and a lower surface 314. The ceramic ESC 310 has a body formed from a ceramic material such as alumina or other suitable material. The ceramic ESC 310 has one or more electrodes 302 and a plurality of heaters 304 disposed in the body. The electrodes 302 are configured for chucking a substrate to the substrate supporting surface 312. The plurality of heaters 304 may include primary and secondary heaters for creating a multitude of zones for discreetly heating the substrate supporting surface 312 and thus a substrate supported on the substrate supporting surface 312.

The insulating bond 320 has a top surface 322 and a bottom surface 324. The top surface 322 is disposed against the top surface 322 of the ESC 310. The bottom surface 324 is disposed against the bonding layer 340. The insulating bond 320 may include a metal on the top or bottom having a thermal conductivity of about 0.2 W/mK to about 4 W/mK. Thus, a temperature differential across the insulating bond 320 may be between about 150 degrees Celsius and about 260 degrees Celsius, such as about 200 degrees Celsius. The insulating bond 420 includes a glass or insulating layer for high temperatures such as 300 degrees Celsius or more. The insulating bond 320 may be formed from $SiO_2$, NGO, or other suitable material. The insulating bond 320 may have a thickness ranging between about ¼ mm to about 2½ mm.

The bonding layer 340 has an upper surface 342 and a lower surface 344. The upper surface 342 is in contact with the bottom surface 324 of the insulating bond 320. The lower surface 344 is disposed on the cooling base 350. The bonding layer 340 may be formed from silicone or other suitable material suitable for operation at temperatures of about 200 degrees Celsius. The bonding layer 340 has a thermal conductivity of about 0.2 W/mK to about 1.5 W/mK, such as about 0.9 W/mK. The bonding layer 340 may have a temperature drop from the upper surface 342 to the lower surface 344 of about 200 degrees Celsius. The bonding layer 340 is low temperature bond having a thickness between about 0.1 mm and about 1.0 mm such as about 0.3 mm. The bonding layer 340 additionally insulates the secondary heaters 140 from the cooling base 350 such as to aids in preventing the smearing of the micro-zone effect of the heaters in the ceramic ESC 310.

The cooling base 350 has a plurality of cooling channels through which a cooling fluid flows. The cooling base 350 is formed from aluminum or other suitable metal or metal alloy. The cooling base 350 has a top surface 352 and a bottom surface. The top surface 352 of the cooling base 350 is in contact with the bonding layer 340. The cooling base 350 is provided to regulate the temperature of the substrate support assembly 300. Additionally, the cooling base 350 prevents the high temperatures generated from the heaters 304 in the ceramic ESC 310 from causing thermal damage to the facility plate and lower components of the substrate support assembly 300. Additionally, in some examples, the cooling base 350 may serve as the RF electrode and be coupled to a power source for energizing the RF electrode.

The insulating bond 320 does not extend the full length of the cooling base 350. A first gap 370 extends between an outer edge of the insulating bond 320 and the outer periphery of the ceramic ESC 310. Similarly, the bonding layer 340 does not extend the full length of the cooling base 350. A second gap 372 extends between an outer edge of the bonding layer 340 and the outer periphery of the cooling base 350. The first gap 370 and the second gap 372 may be substantially similar in size such that when the bonding layer 340 and the insulating bond 320 are placed together in forming the substrate support assembly 127, that a seal 392, such as an o-ring, may fit therein. The seal 392 disposed between the ceramic ESC 310 and the cooling base 350 protects the bonding layer 340 and the insulating bond 320 from exposure to the plasma and chemicals present in the processing chamber environment, thus extending the longevity of the bonding layer 340 and the insulating bond 320.

Figure 4:
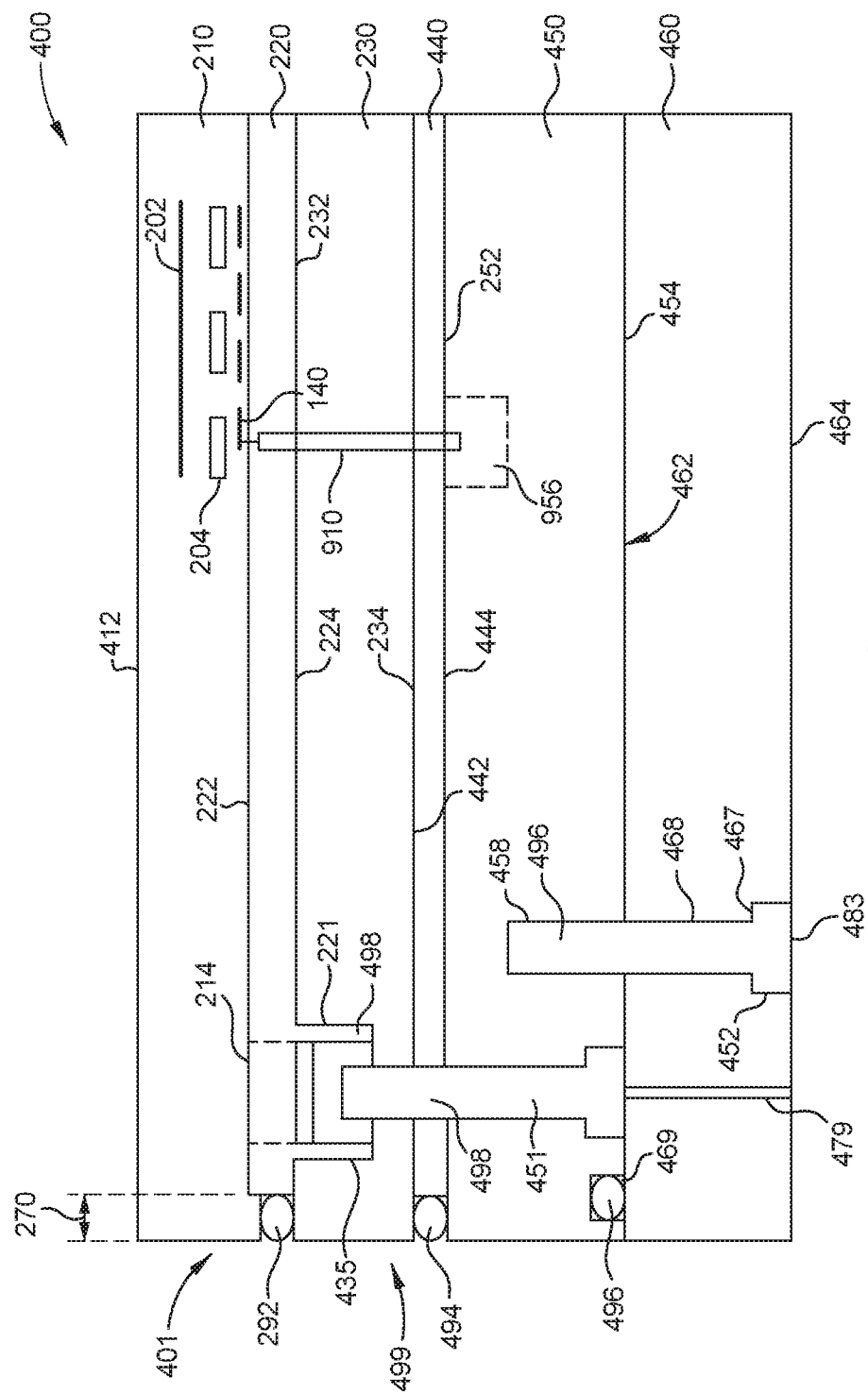
FIG. 4 is a schematic partial side view of the substrate support assembly, according to yet another example.

FIG. 4 is a schematic partial side view of the substrate support assembly 400, according to yet another example. The substrate support assembly 400 may be utilized in the processing chamber 100 described above in place of the substrate support assembly 126. The substrate support assembly 400 is formed from a stack of layers which include a ceramic ESC 210, metal bond 220, a ceramic plate 230, a thermal interface layer 440, a cooling base 450 and a facility plate 460. The ceramic ESC 210, metal bond 220, a ceramic plate 230 may be substantially similar to that described above with respect to FIG. 2. Additionally, the heater configuration in an example with the ceramic plate 230 split into the first ceramic plate 230A and second ceramic plate 230B is additionally considered. The thermal interface layer 440 may include the interface 245 described above with respect to thermal interface layer 240. The substrate support assembly 400 utilizes the thermal interface layer 440 to reduce the heat transfer between the ESC 210 and the cooling base 450 while preventing warping, bowing or other undesirable thermally induced movement in the stack of layers forming the substrate support assembly 400. The thermal interface layer 440 additionally inhibits the cooling base 450 from smearing the discrete temperature micro zones 199 in the ESC 210.

The thermal interface layer 440 has an upper surface 442 and a lower surface 444. The upper surface 442 is in contact with the bottom surface 434 of the ceramic plate 230. The lower surface 444 is similarly sized to the cooling base 450 and disposed on the cooling base 450. The thermal interface layer 440 may be formed from high temperature polymer, such as a polyimide, or other suitable material. The thermal interface layer 440 prevents the smearing of the micro-zone effect of the heaters in the ceramic ESC 210 by insulating the heat loss from the micro zones 199 to the cooling base 250. The thermal interface layer 440 may have a thickness ranging between about ¼ mm to about 2½ mm.

The thermal interface layer 440 does not extend the full length of the ceramic plate 230 or the cooling base 450. An outer edge of the thermal interface layer 440 is spaced from the outer periphery of the ceramic plate 230 and the cooling base 450 similarly to the gap 270. The gap 470 is size to accept the gasket 494, or such as an o-ring. The seal 492 forms an airtight seal between the ceramic plate 230 and the cooling base 450. The gasket 294 protects the thermal interface layer 440 from exposure to the plasma and chemicals present in the processing chamber environment.

The cooling base 450 has a plurality of cooling channels through which a cooling fluid is circulated during operation. The cooling base 450 has a top surface 452 that is in contact with the lower surface 444 of the thermal interface layer 240. The cooling base 450 has a plurality of cooling channels in which a cooling fluid flows to regulate the temperature of the cooling base 450. The cooling base 450 regulates the temperature of the substrate support assembly 400 by flowing coolant therein to maintain the temperature of the cooling base 450 by removing heat with the cooling fluid. Additionally, the cooling base 450 prevents the high temperatures generated from the heaters 204 in the ceramic ESC 210 from causing thermal damage to the facility plate 460 and lower components of the substrate support assembly 400.

The cooling base 450 has a hole 458 and a first through-hole 451. The hole 458 may be a threaded blind hole or other type of hole having a fastener, such as a nut, disposed therein. The first through-hole 451 aligns with the hole 238 in the ceramic plate 230. A fastener 498 is configured to extend through the first through-hole 451 to the insert 284 in the cavity 235 of the ceramic plate 230. The fastener 498 secures the ceramic plate 230 to the cooling base 450. The insert 284 is formed from an electrically conductive material, such as molybdenum, aluminum or other suitable material and is in contact with the flaps 221 of the metal bond 220. The fastener 498 provides a conductive RF connection to the metal bond 220 from a power lead 479 disposed through the facility plate 460 when the metal bond 220 is an electrode.

The cooling base 450 additionally has the convection cooled cavity 950 described above with respect to cooling base 250. The micro-zone connector 910 coupled to the secondary heaters 140 in the ESC 210 extends to the convection cooled cavity 950 in the same manner as described above and has a temperature drop from the first end to the second end of about 200° C.

A facility plate 460 is disposed below the cooling base 450. The facility plate 260 has an upper surface 462 and lower surface 464. The upper surface 462 is disposed against cooling base 250. The facility plate 460 has a seal groove 469 disposed in the upper surface 462. Alternately, the seal groove 469 may be formed on the bottom surface 454 of the cooling base 450. A gasket 494 is disposed in the seal groove 469 for making an airtight seal between the cooling base 450 and the facility plate 460. The facility plate 460 is formed from aluminum, an aluminum alloy or other suitable material. The electrical connections powering the electrode, heaters and various components of the substrate support assembly 200 extend through the facility plate 460.

The facility plate 460 has through-hole 468 extending therethrough. The through-hole 468 aligns with the hole 458 in the cooling base 450. A recess 467 is formed on the lower surface 464 of the facility plate 460 and is aligned with the through-hole 468. A fastener 496 has a head 482. The head 482 of the fastener 496 fits into the facility plate 260 and abuts there against. The hole 458 in the cooling base 450 is configured to accept the fastener 281. For example, the hole 458 may be threaded. The fastener 281 secures the cooling base 450 to the facility plate 460.

In the various embodiments described above, the substrate support assemblies having an electrostatic chuck with 150 or more heating zones (micro zones). The ESC is disposed on a cooling base with one or more layers between to prevent provide a strong bond to the cooling base without bowing the ESC. The one or more layers includes an insulating layer which prevents heat dump from the ESC into the cooling base. Additionally, the insulating layer enables high temperature operation such as temperatures in excess of about 300 degrees Celsius. The insulating layer prevents the plurality of heater micro zones, such as 150 or more micro zones on the ESC, from smearing between the micro zones and thus enables discrete control of the temperature at each micro zone.

While the foregoing is directed to implementations of the present invention, other and further implementations of the invention may be devised without departing from the basic scope thereof, and the scope thereof is determined by the claims that follow.

What is claimed is:

1. A substrate support assembly, comprising:
   a first ceramic plate having a workpiece supporting surface and a bottom surface, the first ceramic plate having a plurality of secondary heaters each forming a plurality of micro zones;
   a second ceramic plate having an upper surface and a lower surface;
   a first metal bonding layer disposed between the bottom surface of the first ceramic plate and the upper surface of the second ceramic plate;
   a third ceramic plate having an top portion and a bottom portion, the third ceramic plate having primary heaters; and
   a second metal bonding layer disposed between the lower surface of the second ceramic plate and the top portion of the third ceramic plate.

2. The substrate support assembly of claim 1 wherein the primary heaters have four separately controlled zones.

3. The substrate support assembly of claim 2 wherein the second ceramic plate further comprises:
   a cavity having an insert disposed therein, wherein the insert is configured to accept a fastener.

4. The substrate support assembly of claim 1, further comprising:
   a cooling base having a upper portion, the upper portion of the cooling base disposed below the third ceramic plate; and
   an insulating bond is disposed between the third ceramic plate and the cooling base, wherein a thermal interface between the third ceramic plate and the cooling base permits up to a 300 degrees Celsius temperature differential between the third ceramic plate and the cooling base without bowing or cracking the third ceramic plate.

5. The substrate support assembly of claim 4 wherein the substrate support assembly is configured to have a maximum temperature differential of up to about 300° C. between the third ceramic plate and the cooling base.

6. The substrate support assembly of claim 4 wherein the cooling base is an RF electrode.

7. The substrate support assembly of claim 1 wherein the first metal bonding layer is an RF electrode and the wherein the first metal bonding layer is coupled to an RF power source.

8. The substrate support assembly of claim 1 wherein the first metal bonding layer may has a thickness ranging between about 0.025 mm to about 2 mm.

9. The substrate support assembly of claim 8 wherein the first metal bonding layer and the second metal bonding layer each having a thickness between about 0.1 mm and about 0.6 mm.

10. The substrate support assembly of claim 1 wherein there are at least 150 separate secondary heaters and the secondary heaters are up to about 2 mm from the an outer edge of the first ceramic plate.

11. The substrate support assembly of claim 1 wherein secondary heaters in the first ceramic plate is less than about 3 mm from a workpiece surface.

12. The substrate support assembly of claim 1 wherein the primary heaters have one or more primary heater zones, and the secondary heaters form a plurality of micro zones, wherein a number of micro zones are an order of magnitude than a number or primary heater zones and each individual mircrozone is in one and only one of the primary heater zones.

13. A processing chamber comprising:
   a body having walls and a lid defining an interior processing region;
   a substrate support assembly disposed in the interior processing region, the substrate support assembly comprising:
      a first ceramic plate having a workpiece supporting surface and a bottom surface, the first ceramic plate having a plurality of secondary heaters each forming a plurality of micro zones;
      a second ceramic plate having an upper surface and a lower surface;
      a first metal bonding layer disposed between the bottom surface of the first ceramic plate and the upper surface of the second ceramic plate;
      a third ceramic plate having an top portion and a bottom portion, the third ceramic plate having primary heaters; and
      a second metal bonding layer disposed between the lower surface of the second ceramic plate and the top portion of the third ceramic plate.

14. The processing chamber of claim 13 wherein first metal bond is an RF electrode and the first metal bonding layer is coupled to an RF power source.

15. The processing chamber of claim 13 wherein the primary heaters have four separately controlled zones.

16. The processing chamber of claim 13, further comprising:
   a cooling base having a upper portion, the upper portion of the cooling base disposed below the third ceramic plate; and
   an insulating bond is disposed between the third ceramic plate and the cooling base, wherein a thermal interface between the third ceramic plate and the cooling base permits up to a 300 degrees Celsius temperature differential between the third ceramic plate and the cooling base without bowing or cracking the third ceramic plate.

17. The processing chamber of claim 16 wherein the substrate support assembly is configured to have a maximum temperature differential of up to about 300° C. between the third ceramic plate and the cooling base.

18. The processing chamber of claim 16 wherein the secondary heaters in the first ceramic plate is less than about 3 mm from a workpiece surface.

19. The processing chamber of claim 16 wherein the secondary heaters in the first ceramic plate is less than about 2 mm from the an outer edge of the first ceramic plate.

20. The processing chamber of claim 16 wherein the primary heaters have one or more primary heater zones, and the secondary heaters form a plurality of micro zones, wherein a number of micro zones are an order of magnitude than a number or primary heater zones and each individual mircrozone is in one and only one of the primary heater zones.

* * * * *